(12) United States Patent
Peterson

(10) Patent No.: US 7,408,202 B2
(45) Date of Patent: Aug. 5, 2008

(54) SOLID STATE DEVICE WITH CURRENT SPREADING SEGMENTS

(75) Inventor: Mark D. Peterson, Lake Oswego, OR (US)

(73) Assignee: Infocus Corporation, Wilsonville, OR (US)

( * ) Notice: Subject to any disclaimer, the term of this patent is extended or adjusted under 35 U.S.C. 154(b) by 88 days.

(21) Appl. No.: 11/099,015

(22) Filed: Apr. 4, 2005

(65) Prior Publication Data

US 2006/0220041 A1 Oct. 5, 2006

(51) Int. Cl.
H01L 33/00 (2006.01)
(52) U.S. Cl. ............... 257/98; 257/91; 257/99
(58) Field of Classification Search .............. 257/79, 257/91, 94, 98–99; 359/238, 460
See application file for complete search history.

(56) References Cited

U.S. PATENT DOCUMENTS

| | | | |
|---|---|---|---|
| 6,155,687 A | 12/2000 | Peterson | |
| 6,224,216 B1 | 5/2001 | Parker et al. | |
| 6,419,365 B1 | 7/2002 | Potekev et al. | |
| 6,469,324 B1 * | 10/2002 | Wang | 257/98 |
| 6,517,210 B2 | 2/2003 | Peterson et al. | |
| 6,652,105 B1 | 11/2003 | Peterson et al. | |
| 6,663,244 B1 | 12/2003 | Wichner et al. | |
| 6,672,724 B1 | 1/2004 | Peterson et al. | |
| 6,719,429 B2 | 4/2004 | Peterson | |
| 6,728,032 B2 | 4/2004 | Peterson et al. | |
| 6,804,055 B2 | 10/2004 | Peterson et al. | |
| 6,883,917 B2 | 4/2005 | Wichner et al. | |
| 6,885,036 B2 * | 4/2005 | Tarsa et al. | 257/99 |
| 6,896,375 B2 | 5/2005 | Peterson et al. | |
| 2001/0054989 A1 * | 12/2001 | Zavracky et al. | 345/8 |
| 2003/0072077 A1 | 4/2003 | Peterson et al. | |
| 2003/0164502 A1 * | 9/2003 | Baur et al. | 257/78 |

\* cited by examiner

*Primary Examiner*—Shouxiang Hu
(74) *Attorney, Agent, or Firm*—Schwabe Williamson & Wyatt

(57) ABSTRACT

Solid state devices, such as solid state light emitting devices, having non-linear current spreading segments are disclosed. Projection subsystems and systems equipped with such solid state light emitting devices are also disclosed.

13 Claims, 4 Drawing Sheets

SOLID STATE DEVICE WITH CURRENT SPREADING SEGMENTS

FIELD

Disclosed embodiments of the present invention relate to the fields of solid state devices and image projection, and more particularly to the employment of solid state light emitting devices as illumination sources in image projection systems.

BACKGROUND OF THE INVENTION

Solid state devices, in particular, solid state light emitting devices, are increasingly being employed in various commercial/industrial applications, e.g. digital projection systems.

Solid state light emitting devices typically make use of current spreading segments extending from an electrical contact coupled to the device. An example of a solid state light emitting device is a light emitting diode (LED). The current spreading segments in an LED are typically linear. They facilitate uniform distribution of current across and into a layer of an LED to facilitate current injection into an active layer, which provides for photon emission. These current spreading segments often lie across a light emitting surface of an LED. When such a light emitting surface of an LED is projected, dark lines may be apparent in the projected image as the current spreading segments block the transmission of light from the LED. To homogenize light, image projection systems typically employ an optical integrator in the light path between a light source and a light valve.

BRIEF DESCRIPTION OF THE DRAWINGS

Embodiments of the present invention will be described by way of the accompanying drawings in which like references denote similar elements, and in which.

DETAILED DESCRIPTION OF EMBODIMENTS OF THE INVENTION

Figure 1:
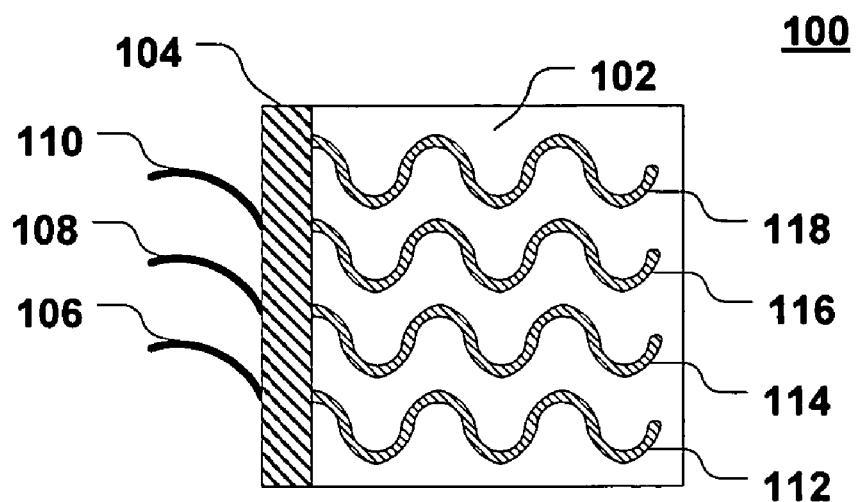
FIG. 1 illustrates a plane view of an LED with non-linear current spreading segments, in accordance with an embodiment of this invention.

Embodiments of the present invention include but are not limited to solid state light emitting devices having non-linear current spreading segments, subsystems including such solid state light emitting devices, and systems including such subsystems. Such solid state light emitting devices include but are not limited to LEDs. The following discussion is presented in the context of LEDs. It is understood that the principles described herein may apply to other solid state devices.

In the following description, various aspects of embodiments of the present invention will be described. However, it will be apparent to those skilled in the art that other embodiments may be practiced with only some or all of the described aspects. For purposes of explanation, specific numbers, materials and configurations are set forth in order to provide a thorough understanding of the embodiments. However, it will be apparent to one skilled in the art that other embodiments may be practiced without the specific details. In other instances, well-known features are omitted or simplified in order not to obscure the description.

Various operations will be described as multiple discrete operations in turn, in a manner that is most helpful in understanding the embodiments, however, the order of description should not be construed as to imply that these operations are necessarily order dependent. In particular, these operations need not be performed in the order of presentation.

The phrase "in one embodiment" is used repeatedly. The phrase generally does not refer to the same embodiment, however, it may. The terms "comprising," "having" and "including" are synonymous, unless the context dictates otherwise.

LEDs are designed in many different configurations by those skilled in the art. While several LED configurations are described as illustrative of some embodiments, various embodiments of the invention are applicable to various LED configurations. The dimensions of layers and other features of LEDs are those as practiced by one skilled in the art, or to be devised as long as they are consistent with the principles of the present invention. Likewise, the materials and fabrication methods available to construct LEDs are those as practiced by one skilled in the art, or to be devised, as long as they are consistent with the principles of the present invention. Regarding materials for example, a non-linear current spreading segment may comprise any conductor or semiconductor, including but not limited to aluminum, copper, gold, silver, polysilicon, indium tin oxide (ITO), p-gallium aluminum arsenide (p-GaAlAs), etc. A non-linear current spreading segment may comprise of multiple types of conductors and semiconductors. In various embodiments, a non-linear current spreading segment may at least partially comprise of one or more transparent materials, e.g., ITO. In various embodiments, a non-linear current spreading segment may at least partially comprise of one or more opaque materials, e.g., copper.

In various embodiments, some of the perimeter of a non-linear current spreading segment may be non-linear. In various other embodiments, the entire perimeter of a non-linear current spreading segment may be non-linear.

While various embodiments illustrated in the figures show one or two electrical contacts, various other embodiments may include any number of electrical contacts. While various embodiments illustrated in the figures show electrical contacts placed on the perimeter of an LED in a plane view of an LED, various embodiments may include electrical contacts placed in any location of an LED in a plane view of an LED.

FIG. 1 illustrates a plane view of an LED with non-linear current spreading segments, in accordance with an embodiment of this invention. As illustrated, LED 100 may include light emitting surface 102. Electrical contact 104 may be coupled to LED 100 and may be coupled to light emitting surface 102 of LED 100. Electrical leads 106 108 110 may be electrically coupled to electrical contact 104 to supply current to LED 100. While the embodiment illustrated in FIG. 1 shows three electrical leads, various embodiments may include a greater or lesser number of electrical leads. In various other embodiments, structures other than electrical leads may be used to supply current to electrical contact 104.

Non-linear current spreading segments 112 114 116 118 each have two ends, with one of the ends of each of the non-linear current spreading segments 112 114 116 118 being coupled to electrical contact 104 and the other end extending from electrical contact 104 across light emitting surface 102 in order to facilitate uniform distribution of current across and into light emitting surface 102. The ends of the non-linear current spreading segments 112 114 116 118 extending across the light emitting surface 102 may be dead ends. Non-linear current spreading segments 112 114 116 118, as depicted, may extend at least partially and non-linearly, and may form rounded oscillating lines across light emitting surface 102. Non-linear current spreading segments 112 114 116 118, as depicted, may have approximately same length. While the embodiment illustrated in FIG. 1 shows four non-linear current spreading segments, various other embodiments may include a greater or lesser number of non-linear current spreading segments. While the embodiment illustrated in FIG. 1 shows non-linear current spreading segments substantively parallel to one another, various embodiments may include other directional configurations of non-linear current spreading segments.

Figure 2:
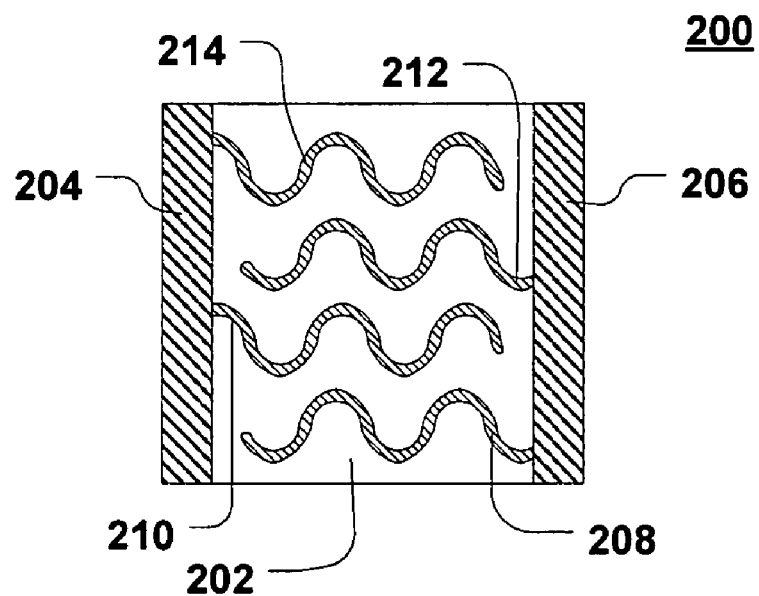
FIG. 2 illustrates a plane view of an LED with non-linear current spreading segments, in accordance with an embodiment of this invention.

FIG. 2 illustrates a plane view of an LED with non-linear current spreading segments, in accordance with an embodiment of this invention. As illustrated, LED 200 may include light emitting surface 202. Electrical contacts 204 206 may be coupled to LED 200 and may be coupled to light emitting surface 202 of LED 200.

Non-linear current spreading segments 208 212 may extend from electrical contact 206 across light emitting surface 202. Non-linear current spreading segments 210 214 may extend from electrical contact 204 across light emitting surface 202. Non-linear current spreading segments 208 210 212 214, as depicted, may extend at least partially and non-linearly, and may form rounded oscillating lines across light emitting surface 202 in order to facilitate uniform distribution of current across and into light emitting surface 202. Non-linear current spreading segments 208 210 212 214, as depicted, may have approximately same length. While the embodiment illustrated in FIG. 2 shows two non-linear current spreading segments originating from an electrical contact, various other embodiments may include a greater or lesser number of non-linear current spreading segments originating from an electrical contact. While the embodiment illustrated in FIG. 2 shows non-linear current spreading segments substantively parallel to one another, various other embodiments may include other directional configurations of non-linear current spreading segments.

Figure 3:
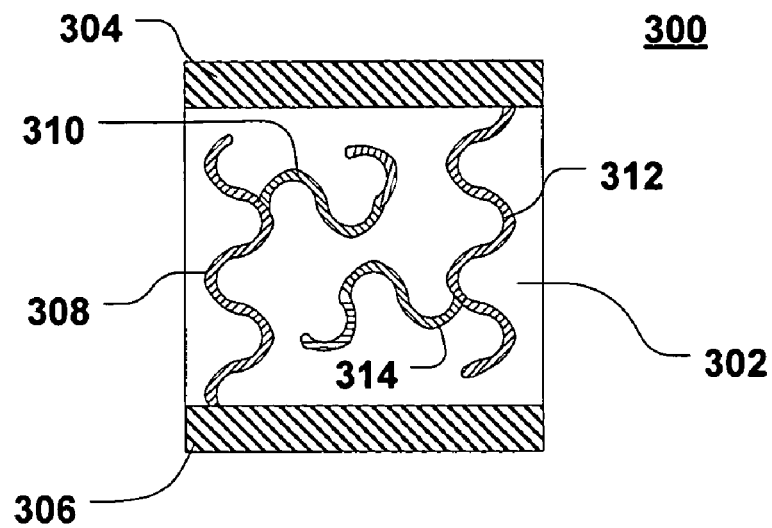
FIG. 3 illustrates a plane view of an LED with non-linear current spreading segments, in accordance with an embodiment of this invention.

FIG. 3 illustrates a plane view of an LED with non-linear current spreading segments, in accordance with an embodiment of this invention. As illustrated, LED 300 may include light emitting surface 302. Electrical contacts 304 306 may be coupled to LED 300 and may be coupled to light emitting surface 302 of LED 300.

Non-linear current spreading segment 308 may extend from electrical contact 306 across light emitting surface 302. Non-linear current spreading segment 312 may extend from electrical contact 304 across light emitting surface 302. Non-linear current spreading segment 310 may extend in a substantively orthogonal manner from non-linear current spreading segment 308 across light emitting surface 302. Non-linear current spreading segment 314 may extend in a substantively orthogonal manner from non-linear current spreading segment 312 across light emitting surface 302. Non-linear current spreading segments 308 310 312 314, as depicted, may extend at least partially and non-linearly, and may form rounded oscillating lines across light emitting surface 302 in order to facilitate uniform distribution of current across and into light emitting surface 302.

While the embodiment illustrated in FIG. 3 shows one non-linear current spreading segment extending from another non-linear current spreading segment, various other embodiments may include a greater or lesser number of non-linear current spreading segments extending from another non-linear current spreading segment. While the embodiment illustrated in FIG. 3 depicts one non-linear current spreading segment extending from another non-linear current spreading segment in a substantively orthogonal manner, various other embodiments may include other directional configurations of non-linear current spreading segments extending from one another.

Figure 4:
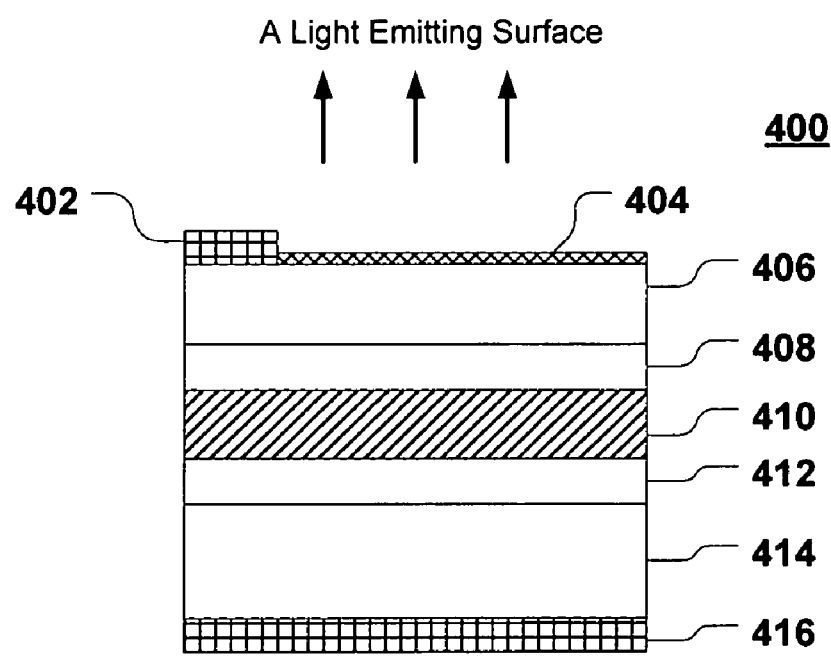
FIG. 4 illustrates a side view of an LED with non-linear current spreading segments, in accordance with an embodiment of this invention.

FIG. 4 illustrates a side view of an LED with at least one non-linear current spreading segment, in accordance with an embodiment of this invention. As illustrated, LED 400 may include electrical contact 402 coupled to p-type layer 406. Electrical contact 402 may be coupled to p-type layer 406 in any manner of ways as practiced by those skilled in the art. Electrical contact 402 may also be coupled to current spreading segment 404 of LED 400. Current spreading segment 404 may be coupled to p-type layer 406. P-type layer 406 may be coupled to active layer 408. As illustrated in a side view in FIG. 4, current spreading segment 404 may represent one or more current spreading segments extending at least partially and non-linearly across a surface of p-type layer 406 in order to facilitate uniform distribution of current through p-type layer 406 into active layer 408.

Active layer 408 may be coupled to n-type layer 410. In various embodiments, n-type layer 410 may be coupled to reflective layer 412, and reflective layer 412 may be coupled to substrate 414. In various other embodiments, n-type layer 410 may be coupled to substrate 414, and there may be no reflective layer between n-type layer 410 and substrate 414. Substrate 414 may be coupled to electrical contact 416. In various other embodiments, the respective positions of p-type layer 406 and n-type layer 410 may be reversed, and current spreading segment 404 may facilitate uniform distribution of current through an n-type layer into an active layer.

Figure 5:
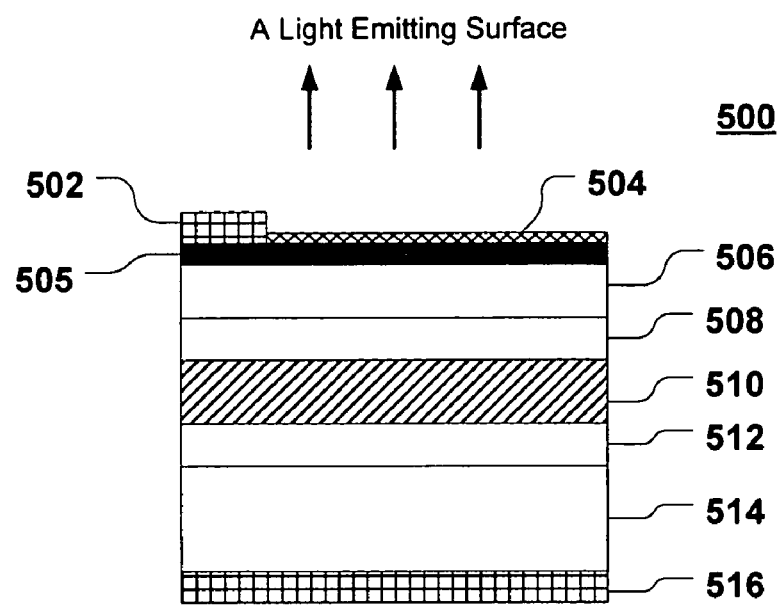
FIG. 5 illustrates a side view of an LED with non-linear current spreading segments, in accordance with an embodiment of this invention.

FIG. 5 illustrates a side view of an LED with at least one non-linear current spreading segment, in accordance with an embodiment of this invention. As illustrated, LED 500 may include electrical contact 502 coupled to current spreading layer 505. In various other embodiments, electrical contact 502 may also be coupled to p-type layer 506. Electrical contact 502 may be coupled to current spreading layer 505 and to p-type layer 506 in any manner of ways as practiced by those skilled in the art. Electrical contact 502 may also be coupled to current spreading segment 504 of LED 500. Current spreading segment 504 may be coupled to current spreading layer 505. Current spreading layer 505 may be coupled to p-type layer 506. P-type layer 506 may be coupled to active layer 508. As illustrated in a side view in FIG. 5, current spreading segment 504 may represent one or more current spreading segments extending at least partially and non-linearly across a surface of current spreading layer 505 in order to facilitate uniform distribution of current through current spreading layer 505, which may in turn facilitate uniform distribution of current through p-type layer 506 into active layer 508.

Active layer 508 may be coupled to n-type layer 510. In various embodiments, n-type layer 510 may be coupled to reflective layer 512, and reflective layer 512 may be coupled to substrate 514. In various other embodiments, n-type layer 510 may be coupled to substrate 514, and there may be no reflective layer between n-type layer 510 and substrate 514. Substrate 514 may be coupled to electrical contact 516. In various embodiments, the respective positions of p-type layer 506 and n-type layer 510 may be reversed, and current spreading segment 504 may facilitate uniform distribution of current through current spreading layer 505, which may in turn facilitate uniform distribution of current through an n-type layer into an active layer.

The materials comprising the layers in LED 500 and the fabrication methods available to construct LED 500 are those as practiced by one skilled in the art. For example, in various embodiments, current spreading layer 505 may comprise any conductive transparent or semitransparent material, including but not limited to p-gallium aluminum arsenide (p-GaAlAs).

Figure 6:
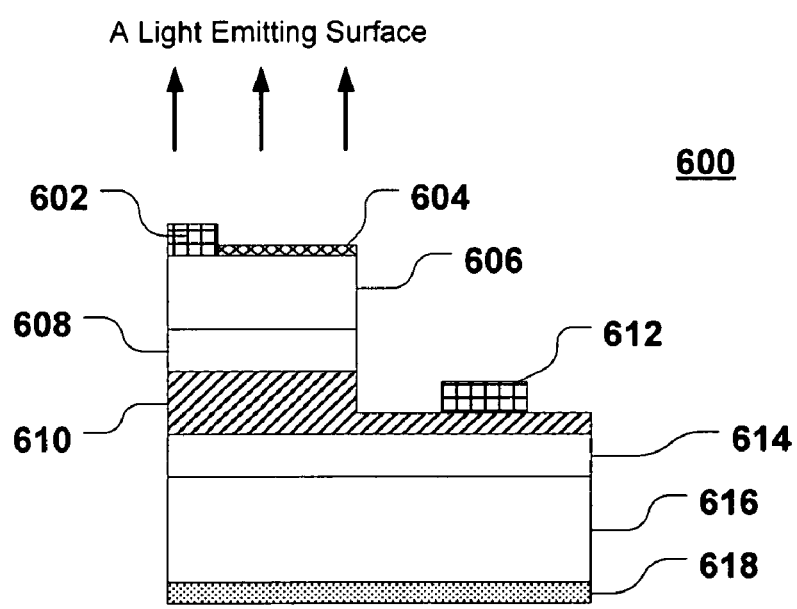
FIG. 6 illustrates a side view of an LED with non-linear current spreading segments, in accordance with an embodiment of this invention.

FIG. 6 illustrates a side view of an LED with at least one non-linear current spreading segment, in accordance with an embodiment of this invention. As illustrated in FIG. 6, LED 600 may include electrical contact 602 coupled to p-type layer 606. Electrical contact 602 may be coupled to p-type layer 606 in any manner of ways as practiced by those skilled in the art. Electrical contact 602 may also be coupled to current spreading segment 604 of LED 600. Current spreading segment 604 may be coupled to p-type layer 606. P-type layer 606 may be coupled to active layer 608. As illustrated in a side view in FIG. 6, current spreading segment 604 may represent one or more current spreading segments extending at least partially and non-linearly across a surface of p-type layer 606 in order to facilitate uniform distribution of current through p-type layer 606 into active layer 608.

Active layer 608 may be coupled to n-type layer 610. In various embodiments, n-type layer 610 may be coupled to adhesive layer 614, and adhesive layer 614 may be coupled to substrate 616. In various other embodiments, n-type layer 610 may be coupled to substrate 616, and there may be no adhesive layer between n-type layer 610 and substrate 616. N-type layer 610 may be coupled to electrical contact 612. In various other embodiments, the respective positions of p-type layer 606 and n-type layer 610 may be reversed, and current spreading segment 604 may facilitate uniform distribution of current through an n-type layer into an active layer. In various embodiments, adhesive layer 614 may also have reflective properties. In various embodiments, substrate 616 may be coupled to reflective layer 618.

Figure 7:
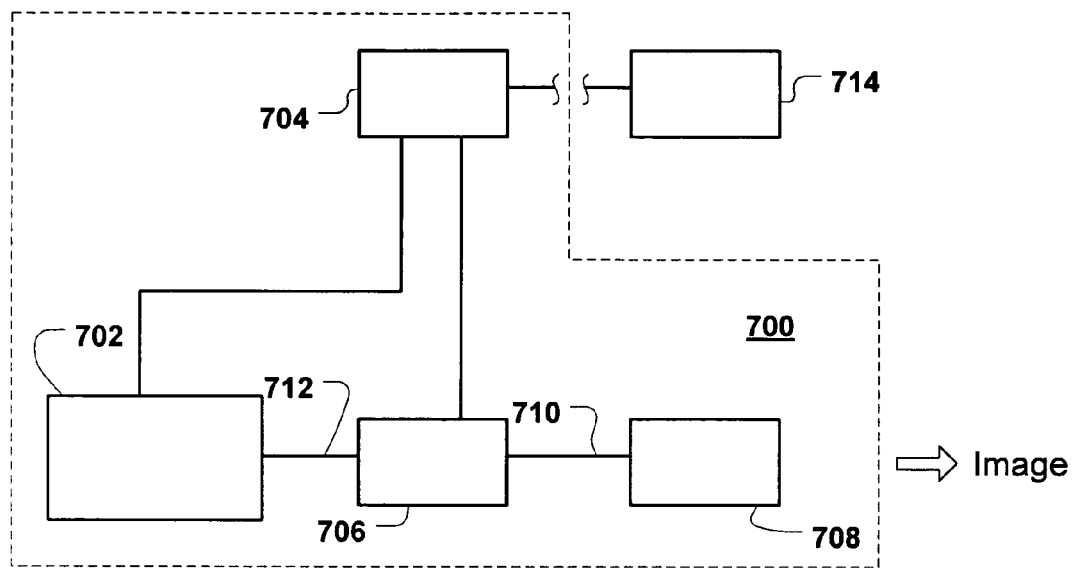
FIG. 7 illustrates a projection system that uses an LED based illumination source which includes an LED with non-linear current spreading segments, in accordance with an embodiment of this invention.

FIG. 7 illustrates projection system 700, which includes LED based illumination source 702, having at least one LED with at least one non-linear current spreading line, in accordance with an embodiment of this invention. LED based illumination source 702 may be optically coupled to light valve 706. Light valve 706 may comprise a digital micromirror device (DMD), a liquid crystal-based device, or another type of display device. LED based illumination source 702 may sequentially provide light valve 706 with incident light 712 of a number of constituent colors by pulsing one or more LEDs of each constituent color. The constituent colors may be thought of as individual colors that, when combined in the appropriate amounts, create an object color for the image pixel. In one embodiment the constituent colors may include red, green and blue, however, alternative embodiments may additionally or alternatively employ many other colors, including white and other color combinations.

Light valve 706 may be coupled to controller 704. Controller 704 may be adapted to receive image signals from image signal source 714 and to transmit light valve control signals to light valve 706. In various embodiments, image signal source 714 may include, but is not limited to, a personal or laptop computer, a personal data assistant (PDA), a cellular phone, a digital versatile disk (DVD) player, a set-top box, an integrated television tuner, a video camera, or any other source suitable for transmitting image signals to projection system 700. Projection system 700 may be implemented in a variety of different applications including, but not limited to, games, movies, television, advertising and data display.

In various embodiments, image signal source 714 may represent the source of an image signal being transmitted over a communications network to projection system 700. Such a network may include one or more of the following example communications networks: a personal area network (PAN), a local area network (LAN), a wide area network (WAN), a metropolitan area network (MAN), the Internet, etc. In various embodiments, such networks may in whole or in part comprise of landline and wireless links.

Controller 704 may generate image frames from an analog image signal based on a desired frame rate. This process may be omitted if the incoming image signal is a digital signal, as the image frames should already be defined. However, there may be some instances where a frame rate conversion of the source video signal may be desired. Based on the desired object color of each image pixel, controller 704 may generate and route pixel control data for the individual light valve pixels in order to facilitate the modulation of incident light 712 from LED based illumination source 702 into image bearing light 710. Controller 704 may synchronize pixel control data with LED pulse sequences. Image bearing light 710 may then be passed on to projection optics 708, which may facilitate final imaging. In various embodiments, final imaging may occur on a screen, a display, or some other suitable device. Projection optics 708 may include a projection lens, an imaging lens, and/or many other optical components known in the field.

In various embodiments, LED based illumination source 702 may by itself, or with additional components, comprise a subsystem that practices the invention. Additional components may include one or more components that comprise a projection system, such as, for example, controller 704, light valve 706, projection optics 708, etc.

Figure 8:
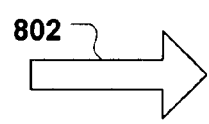
FIG. 8 illustrates some of the components used in an optical engine path, in accordance with an embodiment of this invention.
Figure 8:
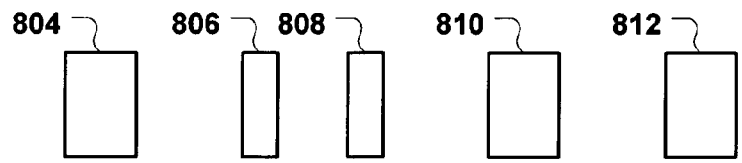

FIG. 8 illustrates some of the components used in optical engine path 800, in accordance with an embodiment of this invention. Optical engine path 800 may represent an optical engine path for one color. Arrow 802 may represent the general direction of light in optical engine path 800. Optical engine path 800 may include LED 804, lens 806, color combination optic 808, light valve 810, and projection optics 812. LED 804 may have at least one non-linear current spreading segment, in accordance with an embodiment of this invention. Such one or more current spreading segments may at least partially block the transmission of light from LED 804. LED 804 may comprise a rectangular light source. The light emitted by LED 804 may travel through various optics, as represented by lens 806 and color combination optic 808. Lens 806 may represent one or more lenses. In various other embodiments, lens 806 and/or color combination optic 808 may be configured differently or may not be present. In various other embodiments, other lenses may be present in optical engine path 800.

LED 804 may be imaged directly onto light valve 810 through such intermediary optics such as lens 806 and/or color combination optic 808. LED 804 may have the same aspect ratio as light valve 810. Light valve 810 may comprise a digital micromirror device (DMD), a liquid crystal-based device, or another type of display device. The imaging of LED 804 onto light valve 810 may be such that the dark shadows of the current spreading segments are substantially blurred out and light valve 810 is substantially illuminated in its entirety. Light transmitted by light valve 810 may pass through projection optics 812, to facilitate final imaging. In various embodiments, final imaging may occur on a screen, a display, or some other suitable device. Projection optics 812 may include a projection lens, an imaging lens, and/or many other optical components known in the field.

Any shadows from current spreading segments on LED 804, or remnants thereof after passing through various stages in optical engine path 800, may ultimately be re-imaged by projection optics 812 and appear in the final image. When such current spreading segments are linear, the linear dark shadows they cause may be readily apparent to an observer. When such current spreading segments are non-linear, the non-linear dark shadows they cause may not be as readily apparent to an observer. In some embodiments, radii of curvature of the shadows on the light valve of 40 pixels or less may result in such shadows being less visible than linear shadows in the final image. In various other embodiments, radii of curvature of the shadows on the light valve of a different number of pixels may be less visible than linear shadows. To homogenize light and avoid any shadows from LED current spreading segments, image projection systems may employ an optical integrator in the light path between a light source and a light valve. An LED with non-linear current spreading segments as disclosed herein may reduce the size of, or eliminate the use of, an integrator in an optical engine path. Elimination of an integrator may, among other things, reduce the size and manufacturing cost and complexity of an image projection system.

Thus, it can be seen from the above description, solid state light emitting devices having non-linear current spreading segments, and projection subsystems and systems so equipped, have been described. While the present invention has been described in terms of the foregoing embodiments, those skilled in the art will recognize that the invention is not limited to the embodiments described. Other embodiments may be practiced with modification and alteration within the spirit and scope of the appended claims. Accordingly, the description is to be regarded as illustrative instead of restrictive.

What is claimed is:

1. A system comprising:
   a light valve; and
   an illumination source optically coupled to the light valve, the illumination source having a solid-state light emitting device to emit light of a first color, including
   a first layer having a surface, and
   a first, second, and third current spreading segments, wherein each of the first, second, and third current spreading segments includes a rounded oscillating line formed of a series of arced segments, the rounded oscillating lines are substantially parallel to each other and extend from an electrical contact at least partially and non-linearly across the surface of the first layer; and
   optics optically coupled to the light valve and the solid-state light emitting device and configured to pass the light of the solid-state light emitting device onto the light valve, without using any optical integrator, in a manner such that the light valve is substantially illuminated, in its entirety, with light of the first color,
   wherein the light valve includes a plurality of pixels and each of the series of arced segments is configured such that a shadow corresponding to each of the arced segments that is imaged onto the light valve has a radius of no greater than forty pixels.

2. The system of claim 1, further comprising:
   a controller coupled to the light valve and the illumination source, adapted to receive an image signal, and to output a light valve control signal to control the light valve to modulate light outputted by the illumination source into image bearing light, based at least in part on the image signal.

3. The system of claim 2, further comprising
   projection optics, optically coupled to the light valve to receive the image bearing light and to project the image.

4. The system of claim 3, wherein the controller is further adapted to control the light valve to project a series of images as video.

5. The system of claim 2, further comprising an image signal source, coupled to the controller, to output the image signal.

6. The system of claim 1, wherein the light valve has an aspect ratio equal to an aspect ratio of the light emitting device.

7. The system of claim 1, wherein each of the first, second, and third current spreading segments consists of the series of arced segments.

8. A system comprising:
   a light valve having a plurality of pixels; and
   a light emitting device configured to provide light to the light valve, the light emitting device including:
   a first layer having a surface, and
   a plurality of current spreading segments, wherein each of the plurality of current spreading segments includes a rounded oscillating line formed of a series of arced segments, the rounded oscillating lines are substantially parallel to each other and extend from an electrode at least partially and non-linearly across the surface of the first layer,
   wherein each of the series of arced segments is configured such that a shadow corresponding to each of the arced segments that is imaged onto the light valve has a radius no greater than forty pixels.

9. The system of claim 8, wherein the light emitted from the light emitting device is provided to light valve without passing through an optical integrator.

10. The system of claim 8, wherein the light valve has an aspect ratio equal to an aspect ratio of the light emitting device.

11. The system of claim 8, wherein a first one of the plurality of current spreading segments includes a first end attached to the electrical contact and a second end, and the light emitting device further includes another current spreading segment, extending, at least partially and non-linearly, from a point on the first one of the plurality of current spreading segments that is between the first end and the second end.

12. A system comprising:
   a light valve;
   a light emitting device include a first layer having a surface, and a plurality of current spreading segments, wherein each of the plurality of current spreading segments includes a rounded oscillating line formed of a series of arced segments, the rounded oscillating lines are substantially parallel to each other and extend from an electrical contact at least partially and non-linearly across the surface of the first layer, emission of light from the light emitting device having a plurality of shadows respectively corresponding to the plurality of current spreading segments; and optics, including one or more lenses and/or a color combination optic, configured to pass the light of the light emitting device, including the plurality of shadows, onto the light valve, wherein the light valve includes a plurality of pixels and the plurality of current spreading segments are configured such that the plurality of shadows imaged on the light valve include shadows corresponding to the arced segments, and the shadows corresponding to the arced segments have radii no greater than forty pixels.

13. The system of claim 12, wherein the light valve has an aspect ratio equal to an aspect ratio of the light emitting device.

* * * * *